(12) United States Patent
Tao et al.

(10) Patent No.: US 7,534,729 B2
(45) Date of Patent: May 19, 2009

(54) MODIFICATION OF SEMICONDUCTOR SURFACES IN A LIQUID

(75) Inventors: Meng Tao, Colleyville, TX (US); Muhammad Y. Ali, Irving, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 104 days.

(21) Appl. No.: 11/507,223

(22) Filed: Aug. 21, 2006

(65) Prior Publication Data

US 2006/0286812 A1 Dec. 21, 2006

Related U.S. Application Data

(63) Continuation-in-part of application No. 11/360,139, filed on Feb. 23, 2006, which is a continuation-in-part of application No. 10/822,343, filed on Apr. 12, 2004, and a continuation-in-part of application No. 10/377,015, filed on Feb. 28, 2003, now Pat. No. 6,784,114.

(60) Provisional application No. 60/655,383, filed on Feb. 23, 2005.

(51) Int. Cl.
*H01L 21/31* (2006.01)
*H01L 21/469* (2006.01)

(52) U.S. Cl. ............ 438/769; 438/758; 438/765; 257/E21.055; 257/E23.132

(58) Field of Classification Search ......... 257/E21.055, 257/E23.132; 438/758, 765, 769
See application file for complete search history.

(56) References Cited

U.S. PATENT DOCUMENTS

| | | | | |
|---|---|---|---|---|
| 4,769,682 A | * | 9/1988 | Yang et al. | 136/258 |
| 4,855,015 A | * | 8/1989 | Douglas | 438/9 |
| 5,972,724 A | * | 10/1999 | Arndt et al. | 438/14 |
| 6,287,988 B1 | | 9/2001 | Nagamine et al. | |
| 6,419,742 B1 | | 7/2002 | Kirk et al. | |
| 6,613,677 B1 | | 9/2003 | Herbots et al. | |
| 6,784,114 B1 | | 8/2004 | Tao et al. | |
| 6,921,702 B2 | | 7/2005 | Ahn et al. | |
| 2002/0137195 A1 | * | 9/2002 | Hamers et al. | 435/287.2 |
| 2003/0081463 A1 | * | 5/2003 | Bocian et al. | 365/200 |
| 2006/0199399 A1 | * | 9/2006 | Muscat | 438/798 |

OTHER PUBLICATIONS

M'Saad, H., Michel, J., Lappe, J. J., and Kimerling, L. C. 1994. Electronic passivation of silicon surfaces by halogens. J. Electron. Mater. 23, 5 (May 1994), 487-491. DOI= http://dx.doi.org/10.1007/BF02671234.*

(Continued)

*Primary Examiner*—Michelle Estrada
*Assistant Examiner*—Jarrett J Stark
(74) *Attorney, Agent, or Firm*—Chowdhury & Georgakis, PC

(57) ABSTRACT

Compositions and methods are provided herein that include modifications to at least one surface of a silicon-based semiconductor material. Modifications occur in a liquid and comprise alterations of surface states, passivation, cleaning and/or etching of the surface, thereby providing an improved surface to the semiconductor material. Modifications of surface states include reduction or elimination of an electrically active state of the surface, wherein, at the atomic level, the surface binding characteristics are changed. Passivation includes the termination of dangling bonds on the surface of the semiconductor material.

16 Claims, 6 Drawing Sheets

OTHER PUBLICATIONS

R.M. Tromp, R.J. Hamers, and J.E. Demuth, Si(001) dimmer structure observed with scanning tunneling microscopy, Phys. Rev. Lett., 1985, 1303, 55.

E. Kaxiras, Semiconductor-surface restoration by valence-mending absorbates: Application to Si(100):S and Si(100):Se, Physical Review B, 1991, 6324, 43.

H. Metzner, TH. Haln, and J.-H. Bremer, Structure of sulfur-terminated silicon surfaces, Surf. Sci., 1997, 377-371-374, 379.

J.J. Boland, Structure of the H-saturated Si(100) surface, Phys. Rev. Lett., 1990, 3325, 65.

M. Tao and L.P. Hunt, The thermodynamic behavior of the Si-H system and its role in Si-CVD from $SiH_4$, J. Electrochem. Soc., 1992, 806, 139.

J.E. Northrup, Structure of Si(100)H: Dependence on the H chemical potential, Phys. Rev. B, 1991, 1419, 44.

B.S. Meyerson, F.J. Himpsel, and K. J. Uram, Bistable conditions for low-temperature silicon epitaxy, Appl. Phys. Lett., 1990, 1034, 57.

J.W. Lyding, T.-C Shen, J.S. Hubacek, J.R. Tucker, and G.C. Abeln, Nanoscale patterning and oxidation of H-passivated Si(100)-2×1 surfaces with an ultrahigh vacuum scanning tunneling microscope, Appl. Phys. Lett., 1994, 2010, 64.

T.-C Shien, C. Wang, G.C. Abeln, J.R. Tucker, J.W. Lyding, PH. Avouris, and R.E. Walkup, Atomic-scale desorption through electronic and vibrational excitation mechanisms, Science, 1995, 1590, 268.

J.W. Lyding, UHV STM nanofabrication: progress, technology spin-offs, and challenges, Proceedings of the IEEE, 1997, 589, 85.

T.-C. Shen, C. Wang, and J.R. Tucker, Al nucleation on monohydride and bare Si(001) surfaces: atomic scale patterning, Phys. Rev. Lett., 1997, 1271, 78.

I. Lyubinetsky, Z. Dohnalek, W.J. Choyke, and J.T. Yates, Jr., $Cl_2$ dissociation on Si(100)-(2×1): A statistical study by scanning tunneling microscopy, Phys. Rev. B, 1998, 7950, 58.

M. Chander, Y.Z. Li, D. Rioux, and J.H. Weaver, Patterning of Si(100): Spontaneous etching with $Br_2$, Phys. Rev. Lett., 1993, 4154, 71.

The National Technology Roadmap for Semiconductors, Semiconductor Industry Association, 1997.

A. M. Cowley, S. M. Sze, Surface States and Barrier Height of Metal-Semiconductor Systems, J. Appl. Phys., 1965, 3212-3220, 36.

J. P. Lacharme, N. Benazzi, C. A. Sebenne, Compositional and electronic properties of Si(001)2×1 upon diatomic sulfur interaction, Surf. Sci., 1999, 415-419, 433-435.

A. C. Papageorgopoulos, M. Kamaratos, Adsorption and desorption of Se on Si(100)2×1: surface restoration, Surf. Sci., 1999, 415-419, 433-435.

Michaelson, Herbert B., The work function of the elements and its periodicity, J. Appl. Phys., 1977, 4729-33, 48.

Gould, G., et al., An In Situ Ellipsometric Study of Aqueous NH OH Treatment of Silicon, J. Electrochem. Soc., vol. 136, Apr. 1989, V 136, No. 4, pp. 1108-1112.

* cited by examiner

FIG. 3A
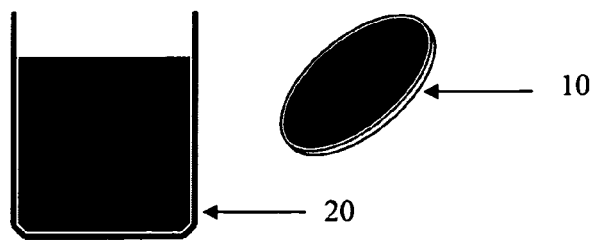
FIG. 3B
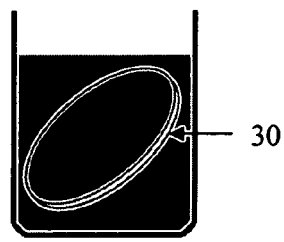
FIG. 3C
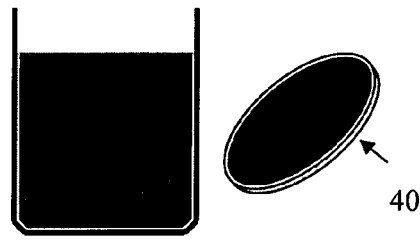
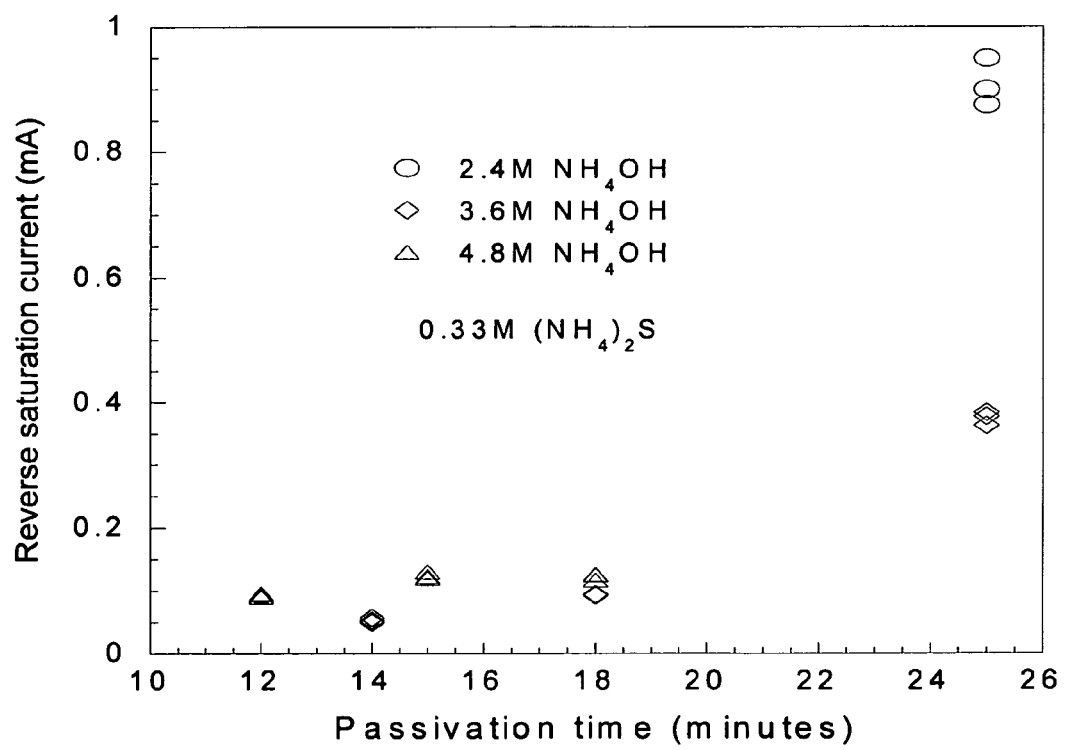
FIG. 4

MODIFICATION OF SEMICONDUCTOR SURFACES IN A LIQUID

CROSS-REFERENCES TO RELATED APPLICATIONS

This application is a continuation-in-part of U.S. patent application Ser. No. 11/360,139, filed Feb. 23, 2006, which claims the benefit of Provisional Application No. 60/655,383 filed Mar. 7, 2005, and is a continuation in part of U.S. application Ser. No. 10/822,343 having a filing date of Apr. 12, 2004, which claims the benefit of and is a continuation-in-part of U.S. application Ser. No. 10/377,015 filed Feb. 28, 2003, now U.S. Pat. No. 6,784,114.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Grant No. 0322762 awarded by The National Science Foundation.

BACKGROUND OF THE INVENTION

The invention relates generally to the field of semiconductor surface engineering and in particular to compositions and methods for preparing such compositions and methods capable of modifying a surface of a semiconductor.

The existence of dangling bonds on a semiconductor surface typically create surface states or bound electronic states on the surface, which are electrically active and a primary problem for most semiconductor surfaces and the devices they are suitable for. Various methods to remove dangling bonds and/or to reduce/remove surface states of a semiconductor material have been used over the years to attempt to improve a semiconductor surface; however most methods impede the ability of a solid-state device to behave as designed. In addition, most processes for removing dangling bonds and/or reducing surface states are typically costly and do not consider throughput, which are two important factors to industry. For example, most passivation processes are carried out in vacuum reactors that are very costly and are not conducive to high throughput. Accordingly, there remains a need to develop improved surfaces and methods that do not impede the semiconductor surface and are cost effective and involve high throughput.

SUMMARY OF THE INVENTION

The present invention solves many problems associated with current limitations in the use of semiconductor surfaces. In particular the invention improves surface engineering of semiconductor compositions and provides improved compositions and methods for preparing such compositions, such compositions and methods having an improved and modified surface.

Generally, a surface of a semiconductor composition or material is provided herein in which the surface is modified in a liquid. Modification includes alteration of surface states, passivation, cleaning and/or etching of the surface, thereby providing an improved surface. The surface itself is a silicon-based material. The modification of surface states include alteration and/or elimination of one or more electronic states of such a surface, wherein, at the atomic level, the surface binding characteristics are changed. In one form, an electrically active is inactivated or eliminated. Passivation includes the termination of dangling bonds on the surface.

Through use of a liquid, problems associated with air-transfer of unwanted features on the surface of a semiconductor material are removed or eliminated, such as contaminants and native oxide. In addition, high-cost and low throughput are no longer issues, as is a concern with vacuum-based passivation processes.

A modified surface as described herein provides improved electrical and chemical properties to the semiconductor composition or material useful in industry and for devices requiring these improved properties.

As the size of a silicon-based device (e.g., CMOS transistor) is reduced, semiconductor materials such as germanium and carbon in the form of silicon-germanium alloys and silicon carbide are being incorporated. Unfortunately, such silicon-based materials suffer from dangling bonds, particularly at high density, and electrically active surface states. As described herein, modification of such surfaces (e.g., passivation of dangling bonds and elimination of active surface states) provides an improved surface for such materials and compositions as well as the devices they comprise.

Those skilled in the art will further appreciate the above-noted features and advantages of the invention together with other important aspects thereof upon reading the detailed description that follows in conjunction with the drawings.

BRIEF DESCRIPTION OF SEVERAL VIEWS OF THE DRAWINGS

For more complete understanding of the features and advantages of the present invention, reference is now made to a description of the invention along with accompanying figures, wherein:

FIG. 3 depicts a representative schematic of an embodiment of a method as described herein;

FIG. 4 depicts a representative example of reverse saturation current at 1 volt for Schottky diodes with aluminum contacts on sulfur-modified n-type silicon (100) substrate as a function of modification time and concentration of liquid;

DETAILED DESCRIPTION OF THE INVENTION

Figure 1A:
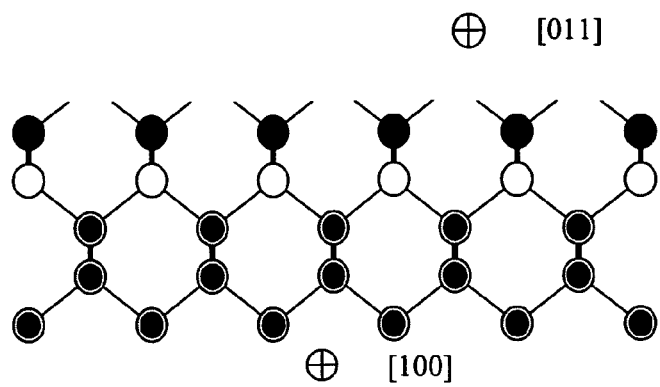
FIG. 1 depicts representative schematics of atomic structures of a nascent silicon (100) surface with (A) side view into the [011] direction and (B) top view into the [100] direction, wherein dark circles are surface atoms, open circles are second-layer atoms, third, fourth, and fifth layer atoms are gray circles, and wherein each surface atom has two dangling bonds.

Although making and using various embodiments are discussed in detail below, it should be appreciated that the present invention provides many inventive concepts that may be embodied in a wide variety of contexts. The specific aspects and embodiments discussed herein are merely illustrative of ways to make and use the invention, and do not limit the scope of the invention.

In the description which follows like parts may be marked throughout the specification and drawing with the same reference numerals, respectively. The drawing figures are not necessarily to scale and certain features may be shown exaggerated in scale or in somewhat generalized or schematic form in the interest of clarity and conciseness.

Dangling bonds are an inherent nature of semiconductor surfaces. Such dangling bonds cause a variety of problems in the fabrication, operation and performance of the semiconductor surface and the compositions and devices they may comprise. They act as sites for chemical reactions and create electronically active surface states that cause the observed properties of electronic devices to vary from their design specifications. On a semiconductor surface, dangling bonds adsorb oxygen, water, or carbon dioxide, and on silicon-based surfaces, a layer of silicon (Si) dioxide (the so-called "native oxide") is formed as soon as the surface is exposed to air.

Figure 1B:
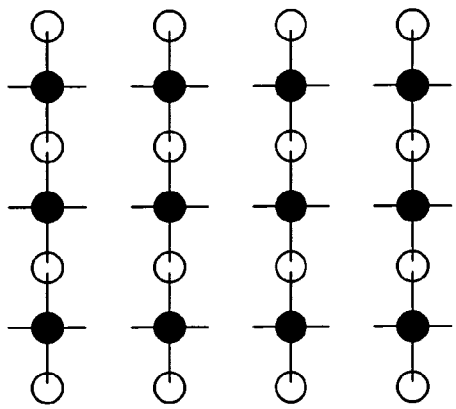

In one form, a semiconductor surface is where chemical bonds are broken and dangling bonds are created. For example, each surface atom on a (100) surface comprising silicon has two dangling bonds, as shown in FIGS. 1A and 1B, which make the surface electrically and chemically reactive. When the surface is exposed to air, the dangling bonds quickly react with air and chemically adsorb molecules or species from the air, such as water ($H_2O$), carbon dioxide ($CO_2$), oxygen ($O_2$), etc. When the surface is in contact with other materials such as metals or metal oxides, interfacial reactions take place, which form an interfacial layer of silicide or oxide with or without heating.

Electrically, surface states originate from dangling bonds and strained surface bonds and often pin the surface Fermi level, causing surface band bending. When a second layer (e.g., metal) is deposited on the silicon (100) surface, surface states (now more appropriately, interface states) pin the interface Fermi level, making the Schottky barrier height less dependent on the second layer work function and silicon electron affinity, and instead, the barrier height is controlled by surface states and/or the pinned interface Fermi-level.

Figure 2A:
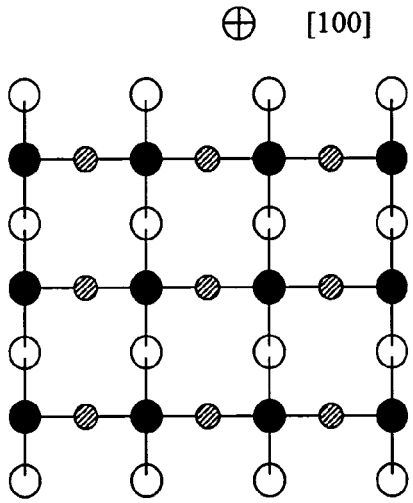
FIG. 2 depicts representative schematics of atomic structures of a passivated silicon (100) surface with a monolayer of a passivant in (A) side view into the [011] direction and (B) top view into the [100] direction, wherein hatched circles represent the passivating atoms and the passivated surface has no dangling bonds.
Figure 2B:
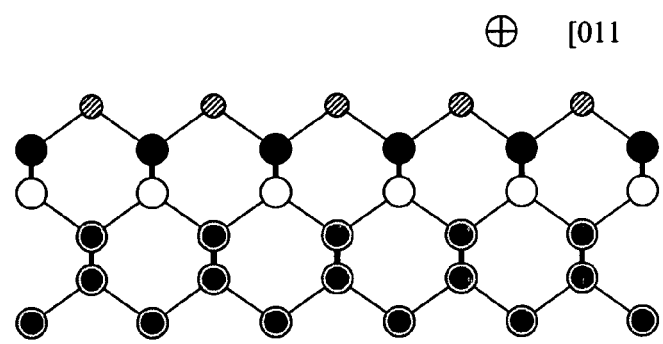

To eliminate dangling bonds on a semiconductor surface, a surface modification may be provided in which a very thin layer of what may be referred to as valence-mending atoms are positioned on the surface, as depicted, as an example, in FIG. 2. In one embodiment, a thin layer of valence mending atoms are positioned, wherein the layer of atoms is one atomic layer thick. For the silicon (100) surface as described above, valence-mending atoms include Group VI elements and congeners, such as sulfur (S), selenium (Se), and tellurium (Te). The atomic structure of a valence-mended silicon (100) surface is represented in FIGS. 2A and 2B.

The concept of valence-mending was proposed to modify the semiconductor surface, e.g., by eliminating dangling bonds on the surface and/or reducing (deactivating) surface states. For a silicon (100) surface, valence-mending atoms may bridge between two surface atoms, thereby terminating or eliminating dangling bonds and relaxing strained bonds on the surface. Examples of valence-mending atoms for silicon-based surfaces [e.g., silicon(100)] include Group VI elements and congeners, such as S, Se and Te. Such elements may be used to passivate a surface of a semiconductor by bridging between surface atoms and eliminating dangling bonds. For other morphologies such as atomic steps on a semiconductor surface, monovalent elements such as halogens of Group VII elements or hydrogen and its isotopes may be used to valence mend and passivate those areas of the semiconductor surface.

A difficulty with valence mending is controlling the amount of the valence mending agent (e.g., passivating agent or passivant) that is incorporated on the surface of the semiconductor substrate and to avoid interference with the intrinsic properties of the semiconductor substrate itself. Therefore, there remains a need for an effective method of modifying a semiconductor surface while concomitantly minimizing any carry over effects from the modification itself. Such a need has been provided herein as well as in U.S. Pat. No. 6,784,114, incorporated by reference herein by way of the description, figures and claims.

Modification of semiconductor substrate using a liquid is further described herein. Using liquid for modification of a semiconductor substrate surface is an effective and low-cost method for improving the surface of the semiconductor substrate. With liquid, the surface is modified (e.g., passivated) without substantially altering properties the underlying substrate. In addition, solid-state devices may be prepared that have greatly lowered Schottky barriers for improved ohmic contacts and greatly raised Schottky barriers for other device functionalities.

As described herein a passivating agent (e.g., valence mending agent, passivant) is provided under conditions that allow the passivant to react with a semiconductor surface. The passivant may react when it actually contacts the surface and in so doing form a layer of material across the surface. The layer may further comprise a monolayer. In some embodiments, a controlled monolayer may be formed by heating at suitable temperatures known to one of ordinary skill in the art (e.g., ranges from about 50 to 150 degrees Centigrade). The formed layer is in a passivated form.

As further described, in one form, addition of a passivating agent suppresses chemical reactivity of a semiconductor substrate surface by eliminating dangling on the surface. A variety of passivants of varying valence may be used.

A difficulty in passivating a surface of a silicon-based semiconductor material in water, an aqueous liquid or an aqueous solution is that the oxide of silicon does not dissolve in such liquids and thus blocks passivation of the semiconductor surface (or areas underneath the oxide layer). Examples of silicon-based semiconductor materials include silicon-germanium alloys, and silicon carbide.

With the benefit of a liquid as provided herein, passivation is allowed to proceed with termination of dangling bonds. In addition, a liquid may act as a suitable etching and/or cleaning agent of the semiconductor surface to remove native oxide and/or purposely grown or deposited oxide and/or remove additional surface contaminants from the surface.

In one form a liquid includes an etching or cleaning agent compatible with the passivant used for passivating a semiconductor surface. Typically, a cleaning agent removes native oxide or other surface contaminants in-situ from at least one surface of a semiconductor material, exposing a fresh and unblocked surface, which typically occurs before the surface is passivated by the passivating agent. An etching agent may be used to remove or eliminate purposely grown or deposited oxide on the same or different surface. In addition, the semiconductor material is typically not removed from the liquid or exposed to air and thus further formation of native oxide on the surface of the semiconductor material does not occur (e.g., due to air exposure). The liquid provides additional features such as removing carbon-based and other contaminants from a surface of the semiconductor material and/or allowing a semiconductor surface with native oxide and/or purposely grown or deposited oxide to be passivated in a liquid.

A passivating agent and an etching agent should be compatible with each other when combined in the same liquid. A passivating agent as described herein is a valence-mending agent, preferably one unable to form a complex with other species in the liquid so that it primarily reacts with dangling bonds on a semiconductor surface and passivates the surface. The passivating agent is also preferably one that does not contaminate the semiconductor surface. Examples of contaminants for silicon-based semiconductors that have proven harmful by others include sodium, potassium, carbon-based compounds, Group V elements (e.g., phosphorous). Some useful passivating agents for a (100) surface of silicon-based semiconductors include sulfur (S) and selenium (Se). In liquid, such passivants may be provided as a solution of ammonium sulfide [$(NH_4)_2S$], ammonium selenide [$(NH_4)_2Se$], and sulfur chloride [$S_2Cl_2$], to name a few.

Suitable etching agents should be compatible with and not react or cross-react with the passivating agent and the semiconductor material. Thus, suitable etching agents do not annul actions of the etching agent or the passivant. Examples of suitable etching agents include solutions of ammonium (e.g., ammonium hydroxide [$NH_4OH$], ammonium fluoride [$NH_4F$], and ammonium chloride [$NH_4Cl$]) and solutions further comprising chloride (Cl). Such etching agents are provided in solutions appropriate for etching as known to one of ordinary skill in the art.

Referring now to FIG. 3A, a silicon-based wafer 10 is introduced to a suitable liquid 20. Typically the wafer is completely immersed in the liquid, shown as immersed wafer 30 in FIG. 3B. After a predetermined period of time, wafer 40 is removed in which at least one surface is modified (e.g., passivated, etched and/or cleaned) as shown in FIG. 3C Several additional examples are herein provided describing further embodiments. In a first example, modification of a silicon (100) surface was performed by sulfur passivation using a solution comprising two primary chemicals: $(NH_4)_2S$ which served as the passivating agent and $NH_4OH$ as the etchant. Here, the cationic component $(NH_4)^+$ is a highly-volatile nonmetallic species and not detrimental to the silicon wafer (or to semiconductor devices). The process included modifying at least one surface of the wafer by adding the wafer into a solution of $(NH_4)_2S$ and $NH_4OH$ for etching and removing the silicon oxide layer and passivating the clean surface with the passivating agent, $S^{2-}$.

Several additional modifications may be made that affect etching time, passivating time, and/or the overall outcome. For example, adjustments may be made to the temperature of the solution, concentration of $NH_4OH$, concentration of $(NH_4)_2S$ or length of time the wafer remains in solution.

By increasing the temperature, the etch rate (e.g., cleaning of silicon oxide by ammonium hydroxide as provided in the first example) is generally affected. Temperatures are thus elevated as desired, but not enough to promote evaporation of the solution. Evaporation temperatures for suitable solutions are known to one of ordinary skill in the art. One of skill in the art will know the suitable temperatures for use with the modifications described herein. For example, with an aqueous solution of $NH_4OH$, a preferred temperature is at or about 60° C., providing a suitable etch rate without significant evaporation.

The concentration of the etchant (e.g., ammonium hydroxide as provided in the first example) may also affect the etch rate. An example of the relationship between reverse saturation, current passivation time and $NH_4OH$ concentration is shown in FIG. 4. Here, a reverse saturation current is depicted at 1 volt for Schottky diodes with aluminum contacts placed on sulfur-passivated n-type silicon (100) substrates. At least one surface of each substrate was first modified by providing the substrate into a solution similar to that exemplified in the first example, in which ammonium hydroxide was provided at varying concentrations (in order to maximize the reverse saturation current). For ammonium hydroxide, a suitable concentration was at around 2.4 M; however, other molar solutions remained useful.

Figure 5:
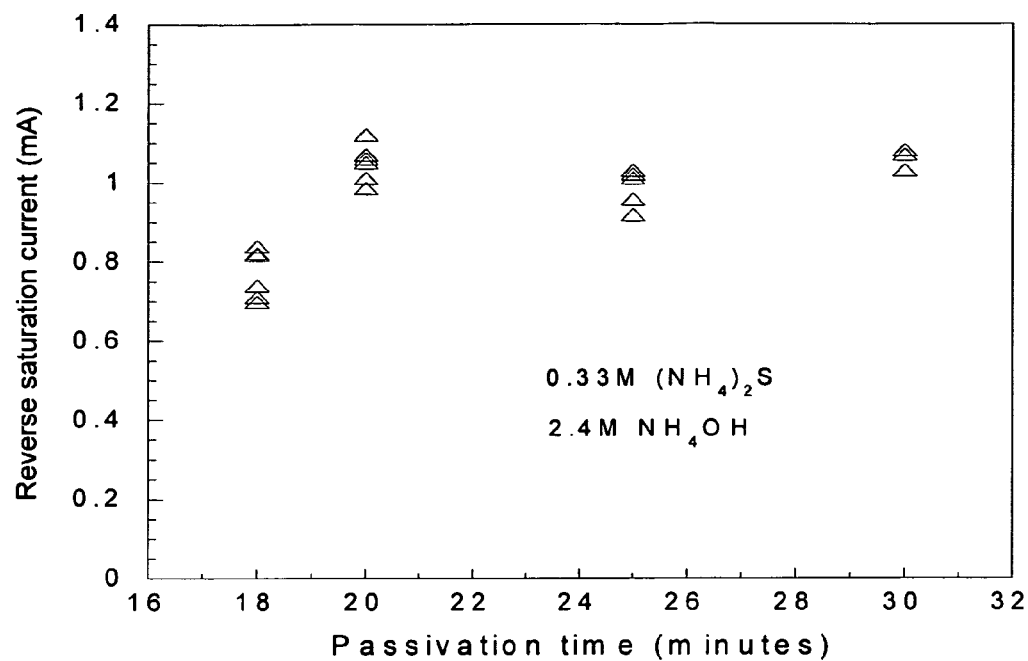
FIG. 5 depicts a representative example of reverse saturation current at 1 volt for Schottky diodes with aluminum contacts on sulfur-modified n-type silicon (100) substrate as a function of modification time.

For modification of passivation time, the concentration of the etchant may be fixed. An example of a relationship between reverse saturation current and passivation time for a fixed concentration of ammonium hydroxide and a fixed concentration of $(NH_4)_2S$ (e.g., as provided in the first example) is depicted in FIG. 5. For an etchant as describe here, a suitable passivation time was at least about twenty to thirty minutes.

Figure 6:
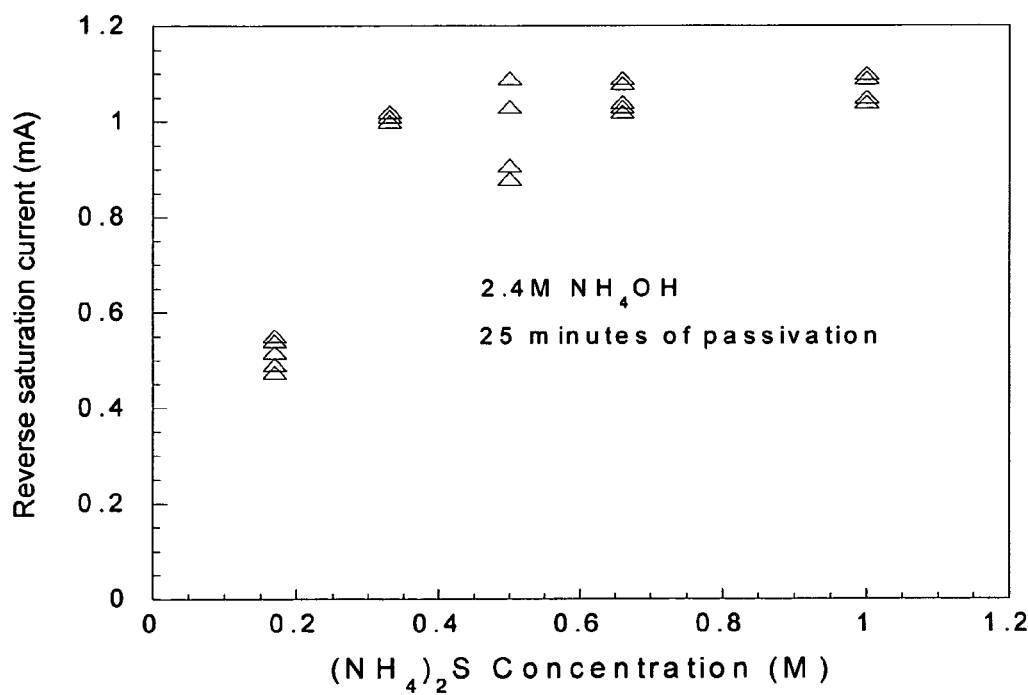
FIG. 6 depicts a representative example of reverse saturation current at 1 volt for Schottky diodes with aluminum contacts on sulfur-modified n-type silicon (100) substrate as a function of concentration of liquid.

Passivation may be further modified by adjusting the concentration of the passivating agent (e.g., ammonium sulfide as provided in the first example). As shown in FIG. 6, time and concentration of ammonium hydroxide were held constant, while the concentration of ammonium sulfide was varied from 0.167 M to 1.0 M, illustrating that a suitable solution of ammonium sulfide was at about 0.33 M to 1.0 M.

In yet another example, a liquid comprising a solution of about 2.4 M ammonium hydroxide and 0.5 M $(NH_4)_2S$ was prepared for modifying a silicon substrate. The silicon (100) wafer substrates were first cleaned in a 2% aqueous solution of hydrofluoride for 30 seconds to remove native oxide and blown dry with nitrogen. A thermally-grown silicon dioxide layer of about 1.8 nm was then formed on each wafer on at least one surface by ozone oxidation at 500° C. Wafers were modified in liquid for about twenty to thirty minutes at about 60 degrees C. by immersion into the liquid described above (about 2.4 M ammonium hydroxide and 0.5 M $(NH_4)_2S$). Schottky diodes were fabricated, placed on each wafer using one of two different metals: aluminum or nickel. Two back-to-back Schottky diodes were characterized by current-voltage measurements. As shown in FIGS. 7-11, modified wafers provided significantly improved electrical properties after modification by passivation.

Figure 7:
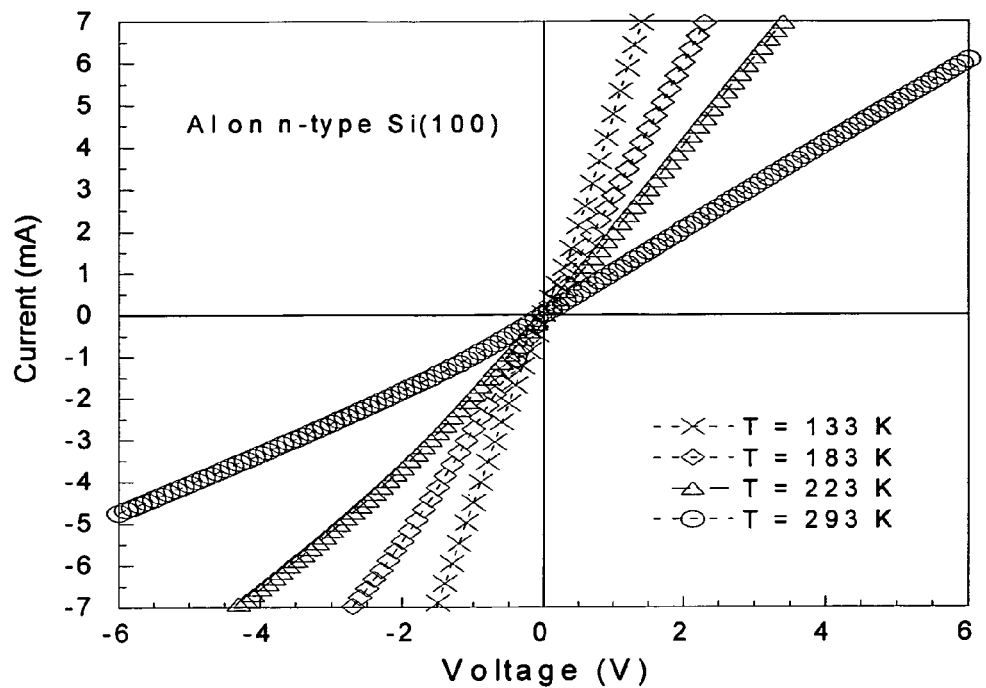
FIG. 7 depicts a representative example of current-voltage characteristics of two back-to-back Schottky diodes with aluminum contacts of about 100 μm in diameter on sulfur-modified n-type silicon (100) substrate at different temperatures.

Referring to FIG. 7, current-voltage characteristics of two back-to-back Schottky diodes with aluminum contacts of 100 µm in diameter on n-type silicon (100) substrates modified by sulfur passivation at different temperatures are shown. The current-voltage characteristics are linear even at temperatures as low as 133 degrees K, indicating a very low Schottky barrier.

Figure 8:
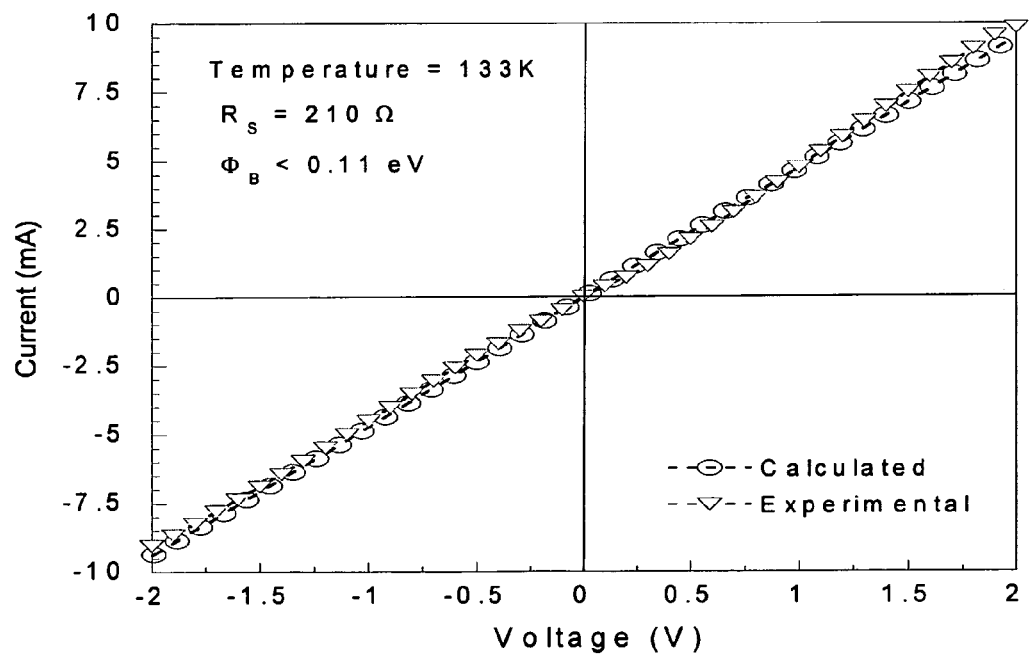
FIG. 8 depicts a representative example of simulated and experimental current-voltage characteristics of two back-toback Schottky diodes with aluminum contacts of 100 μm in diameter on sulfur-modified n-type silicon (100) substrate at 133 K.

Referring to FIG. 8, simulated and experimental current-voltage characteristics are shown for two back-to-back Schottky diodes with aluminum contacts of 100 μm in diameter on modified n-type silicon (100) substrates by sulfur passivation. The simulation is based on the thermionic model with the following parameters: contact size of 100 μm in diameter; temperature T of 133 degrees K; Richardson constant A** of $1.2 \times 10^6$ $A/m^2K^{2}$; barrier height $\phi_B$ of 0.11 eV; series resistance $R_S$=210 Ω. The figure indicates that the Schottky barrier height is no more than 0.11 eV as compared with literature reports for a Schottky barrier height between aluminum and n-type silicon of about 0.72 eV.

Figure 9:
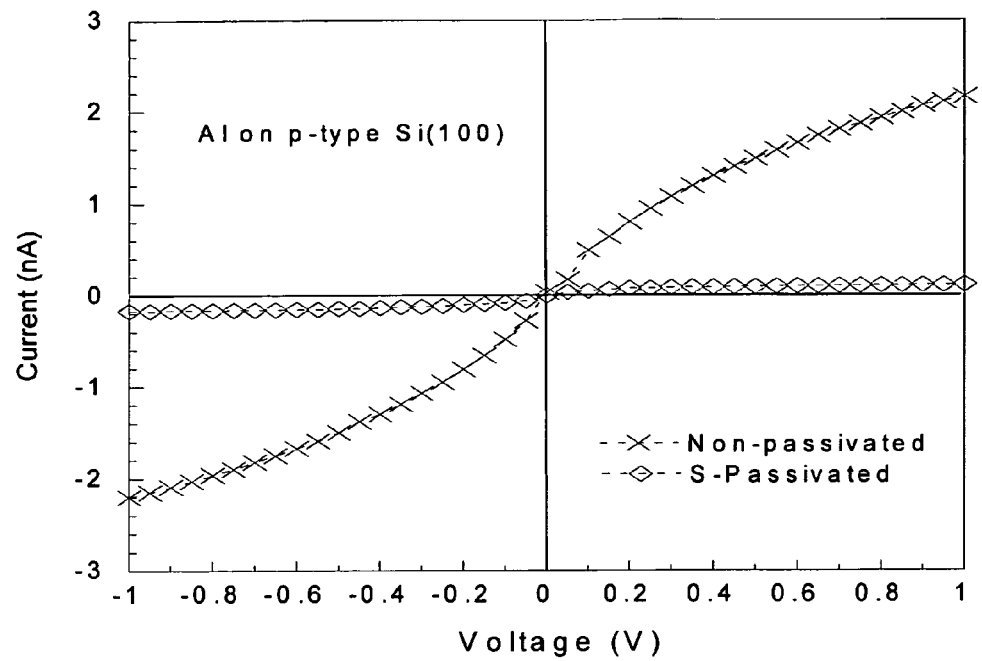
FIG. 9 depicts a representative example of current-voltage characteristics of two back-to-back Schottky diodes with aluminum contacts of about 100 μm in diameter on sulfur-modified p-type silicon (100) substrate at room temperature.

FIG. 9 depicts the current-voltage characteristics of two back-to-back Schottky diodes with aluminum contacts of 100 μm in diameter on p-type silicon (100) substrate. The figure indicates that modification of the silicon substrates by sulfur passivation reduced the reverse saturation current by about 18-fold, thereby providing a significant increase in Schottky barrier height between aluminum and p-type silicon by sulfur passivation.

Figure 10:
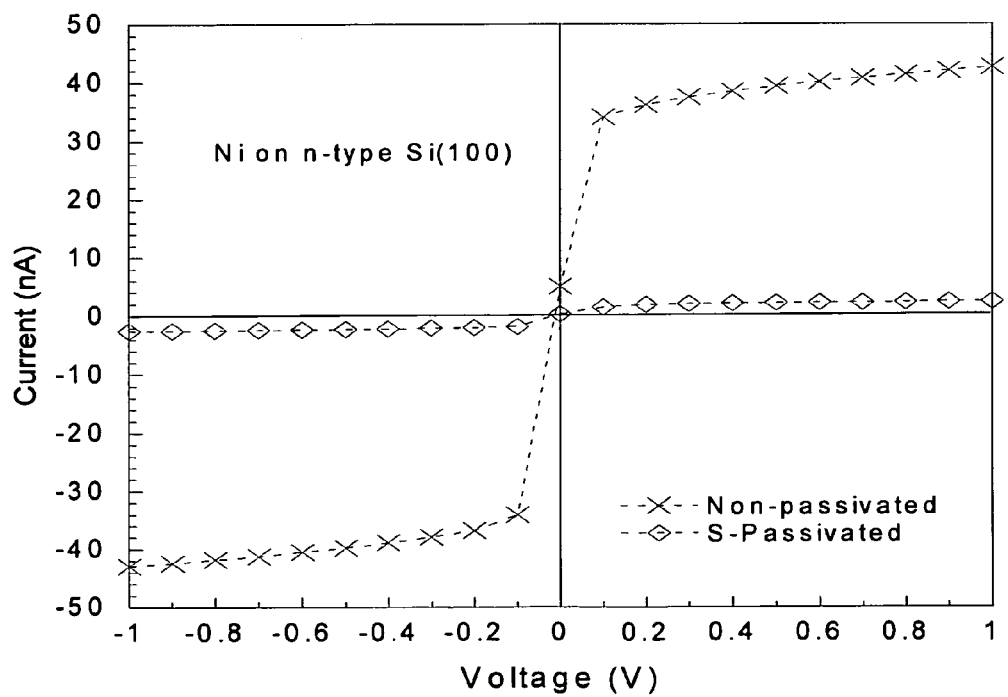
FIG. 10 depicts a representative example of current-voltage characteristics of two back-to-back Schottky diodes with nickel contacts of about 100 μm in diameter on sulfur-modified n-type silicon (100) substrate at room temperature.

Referring to FIG. 10, current-voltage characteristics of two back-to-back Schottky diodes with nickel contacts of 100 μm in diameter on n-type silicon (100) substrates are shown. Modification of at least one surface of the substrates by sulfur passivation was found to reduce the reverse saturation current by about 16-fold, indicating a significant increase in Schottky barrier height between nickel and n-type silicon by sulfur passivation.

Figure 11:
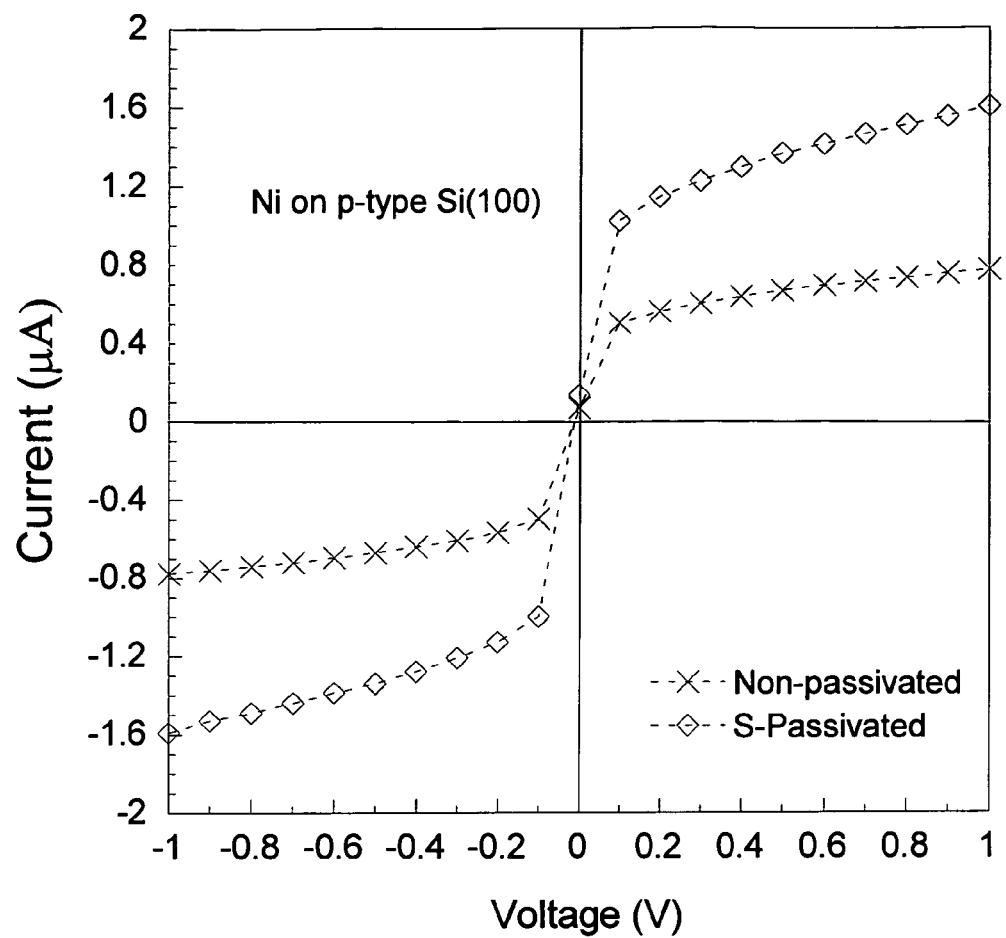
FIG. 11 depicts a representative example of current-voltage characteristics of two back-to-back Schottky diodes with nickel contacts of about 100 μm in diameter on sulfur-modified p-type silicon (100) substrate at room temperature.

Referring to FIG. 11, current-voltage characteristics of two back-to-back Schottky diodes with nickel contacts of 100 μm in diameter on p-type silicon (100) substrates are represented. Modification by sulfur passivation was found to increase the reverse saturation current by a factor of 2, indicating a decrease in Schottky barrier height between nickel and p-type silicon by sulfur passivation.

For FIGS. 9-11, control (non-modified) wafers were prepared by using n-type or p-type silicon (100) wafers having a resistivity of about 5 Ω-cm. Each wafer was cleaned in a 2% aqueous solution of hydrofluoride for about 30 seconds to remove native oxide. The wafer was then blown dry with nitrogen followed by deposition of a 70-nm film of aluminum or nickel on the wafer surface, that was then patterned using a lift-off process.

In still another example, modification of a silicon substrate surface by passivation and etching with selenium was performed. The liquid comprised a solution of $(NH_4)_2Se$ as the passivating agent and $NH_4OH$ as the etchant. The process included cleaning at least one surface of a silicon (100) wafer surface by adding the wafer to the liquid comprising a solution of $(NH_4)_2Se$ and $NH_4OH$. Accordingly, modification included cleaning, etching and passivating the surface in which the $Se^{2-}$ acted as the passivating agent.

When a modifying solution included ammonium sulfide $[(NH_4)_2S]$ dissolved in water with an etchant of ammonium hydroxide $[NH_4OH]$, modifications of a silicon-based substrate may include passivating, cleaning and etching of at least one surface. In another example, a silicon (100) wafer substrate was purposely oxidized in ozone at 500° C. to form an oxide layer of 1.8 nanometers before being modified as described herein. After submerging in a solution containing both ammonium sulfide and ammonium hydroxide for a predetermined period of time (e.g., minutes), the silicon wafer was taken out of the liquid. Schottky diodes were fabricated on the modified wafer with aluminum contact and they were characterized by current-voltage measurements. The current-voltage relations at room temperature were linear and did not show any sign of rectification. In low-temperature measurements, these samples showed linear current-voltage relations at temperatures as low as 133K. Thus, indicating that the Schottky barrier height between aluminum and sulfur-passivated n-type silicon (100) surface is very low due to the modification. By fitting the experimental data with a thermionic model, the barrier height was identified as no more than 0.11 eV, a value for barrier height much lower than that in the literature of 0.72 eV, and demonstrates the positive effects of modification.

Due to the modification of Si dangling bonds on a surface of a silicon-based substrate by passivants as described herein, high density of surface states are significantly reduced. In addition, Schottky barriers formed by one or more different metals on the modified silicon (100) substrate surface show greater sensitivity to their respective work function as further described. Schottky diodes were fabricated using two metals—Al with a small work function (4.28 eV)[1] and Ni with a large work function (5.15 eV)[1]—and provided on one surface of n- and p-type silicon (100) substrates with resistivity of about 5 Ω-cm. Two back-to-back Schottky diodes were characterized by current-voltage measurements. Samples treated with $(NH_4)_2S$ before the addition of Schottky diodes showed significant improvement in current-voltage characteristics over the non-passivated samples.

When Al diodes were provided on a modified surface of p-type silicon (100) wafers, the reverse saturation current of the modified surface was 18 times lower than the non-passivated sample surface. When Ni diodes were provided on a modified surface of n-type Si(100), the reverse current of the modified surface was 16 times lower than the non-passivated sample surface. For Ni on a p-type silicon (100) surface, passivation increased the reverse current by a factor of 2.

The effect of modifications as described herein on Schottky barrier height may be explained by the surface-state theory and the surface-dipole theory. According to the surface-dipole theory, the barrier height of Ni on a S-passivated n-type silicon (100) surface should decrease, while on the S-passivated p-type silicon (100) surface should increase. The surface-state theory suggests the opposite. The examples provided herein indicate the effect of surface states may be a dominant factor in controlling the barrier height in these systems.

Several advantages arise from the methods and compositions described herein. For example, a high series resistance in ultra-shallow source/drain junctions is a serious problem for high-performance silicon CMOS. While, a Schottky barrier source/drain CMOS has been proposed to overcome a series resistance problem in ultra-shallow source/drain junctions of very small (e.g., nanometer-scale) silicon CMOS, the barrier height of the Schottky junction is not typically low enough for improved performance. As described herein, the present invention may be employed to achieve very low Schottky barrier heights.

For a semiconductor device, such as a photovoltaic solar cell, silicon-based materials are a dominant semiconductor material. However, the photovoltaic solar cell suffers from a high density of dangling bonds and electrically active surface states, removal of which are critical aspects for improved performance of such devices. For example, removal of dangling bonds and/or surface states improves efficiency of a solar cell when converting solar radiation into electricity. Dangling bonds and surface states cause a high Schottky barrier for metal contacts on devices, such as solar cells. The high Schottky barrier creates high contact resistance that, in some cases, dramatically reduces the efficiency of the device. Dangling bonds and surface states also create a high surface recombination velocity for photo-generated charge carriers, such that photo-generated electrons and holes recombine at the surface through dangling bonds. This, in turn, also reduces the efficiency of the device. By use of the methods and compositions provided herein, such problems that reduce efficiency of a device are removed and/or eliminated, thereby providing an improved and more efficient device.

Additional objects, advantages and novel features of the invention as set forth in the description, will be apparent to one skilled in the art after reading the foregoing detailed description or may be learned by practice of the invention. The objects and advantages of the invention may be realized and attained by means of the instruments and combinations particularly pointed out here.

What is claimed is:

1. A method for modifying a semiconductor surface comprising:
   providing a semiconductor material having at least one silicon-based surface to a liquid, wherein the liquid comprises at least one passivating agent, wherein the liquid removes oxide from the surface of the semiconductor material, wherein the oxide dissolves in the liquid; and
   maintaining the semiconductor material in the liquid for a suitable period of time to passivate and remove dangling bonds from the at least one surface.

2. The method of claim 1 wherein the passivating agent is selected from the group consisting of a Group IV element, a monovalent element, halogens of Group VII elements, hydrogen and its isotopes, and combinations thereof.

3. The method of claim 1, wherein the liquid further comprises agents for cleaning, etching, and combinations thereof.

4. The method of claim 1, wherein the semiconductor material is selected from the group consisting of germanium, carbon, silicon and combinations thereof.

5. The method of claim 1, wherein the passivating agent forms a layer on the surface of the semiconductor material.

6. The method of claim 5, wherein the layer is formed as a monolayer by heating.

7. The method of claim 1, wherein the method reduces the electrically active surface states of the at least one silicon-based surface.

8. A method for modifying a semiconductor surface comprising:
   providing a semiconductor material having at least one silicon-based surface to a liquid, wherein the liquid comprises at least one passivating agent, wherein the liquid removes oxide from the surface of the semiconductor material, wherein the oxide dissolves in the liquid; and
   maintaining the semiconductor material in the liquid for a suitable period of time to passivate and remove dangling bonds from the at least one surface.

9. A modified semiconductor material provided by the method of claim 1.

10. The method of claim 8, wherein the method removes dangling bonds from the at least one surface.

11. The method of claim 8, wherein the liquid further comprises agents for cleaning, etching, and combinations thereof.

12. The method of claim 8, wherein the semiconductor material is selected from the group consisting of germanium, carbon, silicon and combinations thereof.

13. The method of claim 8, wherein the passivating agent forms a layer on the surface of the semiconductor material.

14. The method of claim 13, wherein the layer is formed as a monolayer by heating.

15. The method of claim 8, wherein the passivating agent is selected from the group consisting of a Group IV element, a monovalent element, halogens of Group VII elements, hydrogen and its isotopes, and combinations thereof.

16. A modified semiconductor material provided by the method of claim 8.

* * * * *